United States Patent
Butler (10) Patent No.: US 7,348,752 B1
(45) Date of Patent: Mar. 25, 2008

(54) STAGE APPARATUS AND LITHOGRAPHIC APPARATUS

(75) Inventor: Hans Butler, Best (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 11/523,736

(22) Filed: Sep. 20, 2006

(51) Int. Cl.
    *H01J 37/20* (2006.01)
(52) U.S. Cl. .................... 318/649; 318/632
(58) Field of Classification Search ........... 318/568.22, 318/632, 649, 653
    See application file for complete search history.

(56) References Cited

U.S. PATENT DOCUMENTS

| | | | |
|---|---|---|---|
| 5,304,811 A * | 4/1994 | Yamada et al. ........ | 250/492.22 |
| 6,441,514 B1 * | 8/2002 | Markle .................. | 310/12 |
| 6,531,793 B1 | 3/2003 | Frissen et al. | |
| 6,608,317 B1 * | 8/2003 | Nakasuji ............... | 250/492.22 |
| 6,770,890 B2 * | 8/2004 | Tanaka .................. | 250/442.11 |
| 6,864,601 B2 * | 3/2005 | Sogard .................. | 355/53 |
| 7,224,429 B2 * | 5/2007 | Hol et al. ............... | 355/53 |
| 2002/0096647 A1 * | 7/2002 | Moors et al. .......... | 250/492.1 |
| 2003/0155820 A1 * | 8/2003 | Tominaga et al. ..... | 310/12 |

\* cited by examiner

*Primary Examiner*—Bentsu Ro
(74) *Attorney, Agent, or Firm*—Pillsbury Winthrop Shaw Pittman LLP

(57) ABSTRACT

A stage apparatus and a lithographic apparatus comprising such a stage apparatus are described. The stage apparatus includes an electromagnetic motor arranged to displace an object table, an electromagnetic actuator configured to position the object table and a device configured to provide a current to the stage apparatus such that, in use, an effect of a stray field of the electromagnetic motor on the electromagnetic actuator is at least partly compensated by the current.

18 Claims, 6 Drawing Sheets

STAGE APPARATUS AND LITHOGRAPHIC APPARATUS

FIELD

The present invention relates to a stage apparatus and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In general, a lithographic apparatus includes one or more object tables arranged to hold a substrate or a patterning device. Such an object table can, in general, be displaced using a stage apparatus. Often, such a stage apparatus includes electromagnetic motors and/or actuators for displacing and positioning the object table. In order to obtain the required positioning accuracy, a combination of both electromagnetic motors (suitable for displacing the object table over comparatively large distances) and electromagnetic actuators (suitable for displacing the object table over comparatively small distances with a high accuracy) is often applied.

As an example of such a stage apparatus, a planar motor as e.g. disclosed in U.S. Pat. No. 6,531,793 (suitable for positioning an object table over comparatively large distances) can be combined with a plurality of electromagnetic actuators for accurate displacement of the object table.

In general, the electromagnetic motor that is arranged to provide a long travel to the object table includes an array of alternating polarized permanent magnets on a first part and a plurality of coils on a second part. During operation of the electromagnetic motor, an electromagnetic actuator that is operated or located in the vicinity of the electromagnetic motor may experience a disturbance caused by the electromagnetic motor. It will be appreciated by a person skilled in the art that an electromagnetic actuator that is displaced relative to an array of permanent magnets can be influenced by the magnetic field of the array. As such, the proper operation or expected response of the electromagnetic actuator may be compromised by the electromagnetic field of the array resulting in a reduced accuracy of the electromagnetic actuator. Similarly, the electromagnetic field generated by a current carrying coil of the electromagnetic motor may cause a disturbance or an improper operation of the electromagnetic actuator.

In order to avoid the influence of an electromagnetic motor on an electromagnetic actuator, one might consider providing a ferromagnetic shield between the motor and the actuator. Such a shield however may be quite heavy and therefore result in an inferior behavior of the stage apparatus. In addition, such a ferromagnetic shield may also be influenced by the electromagnetic field of the motor resulting in the generation of disturbances of the stage apparatus by the shield.

SUMMARY

It is desirable to provide a stage apparatus wherein the influence of an electromagnetic motor on an electromagnetic actuator is mitigated.

According to an embodiment of the invention, there is provided a stage apparatus configured to position an object table including an electromagnetic motor arranged to displace the object table, an electromagnetic actuator configured to position the object table, a current generator configured to provide a current to the stage apparatus such that, in use, an effect of a stray field of the electromagnetic motor on the electromagnetic actuator is at least partly compensated by the current.

According to a further embodiment of the present invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a stage apparatus configured to displace the support or the substrate table, the stage apparatus including an electromagnetic motor arranged to displace the support or the substrate table, an electromagnetic actuator configured to position the support or the substrate table, a current generator configured to provide a current to the stage apparatus such that, in use, an effect of a stray field of the electromagnetic motor on the electromagnetic actuator is at least partly compensated by the current.

According to an embodiment of the invention, there is provided a stage apparatus configured to position a support in a lithographic apparatus, the support configured to hold a substrate or a patterning device, the stage apparatus including a first electromagnetic motor arranged to generate a relatively large displacement of the support; a second electromagnetic motor configured to generate a relatively small displacement of the support, the second electromagnetic motor arranged on the first electromagnetic motor; and a current generator configured to provide a current to a coil arranged in the stage apparatus, the current being selected such that, in use, a corresponding field produced by the coil substantially reduces an effect of a field of the electromagnetic motor on the electromagnetic actuator.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
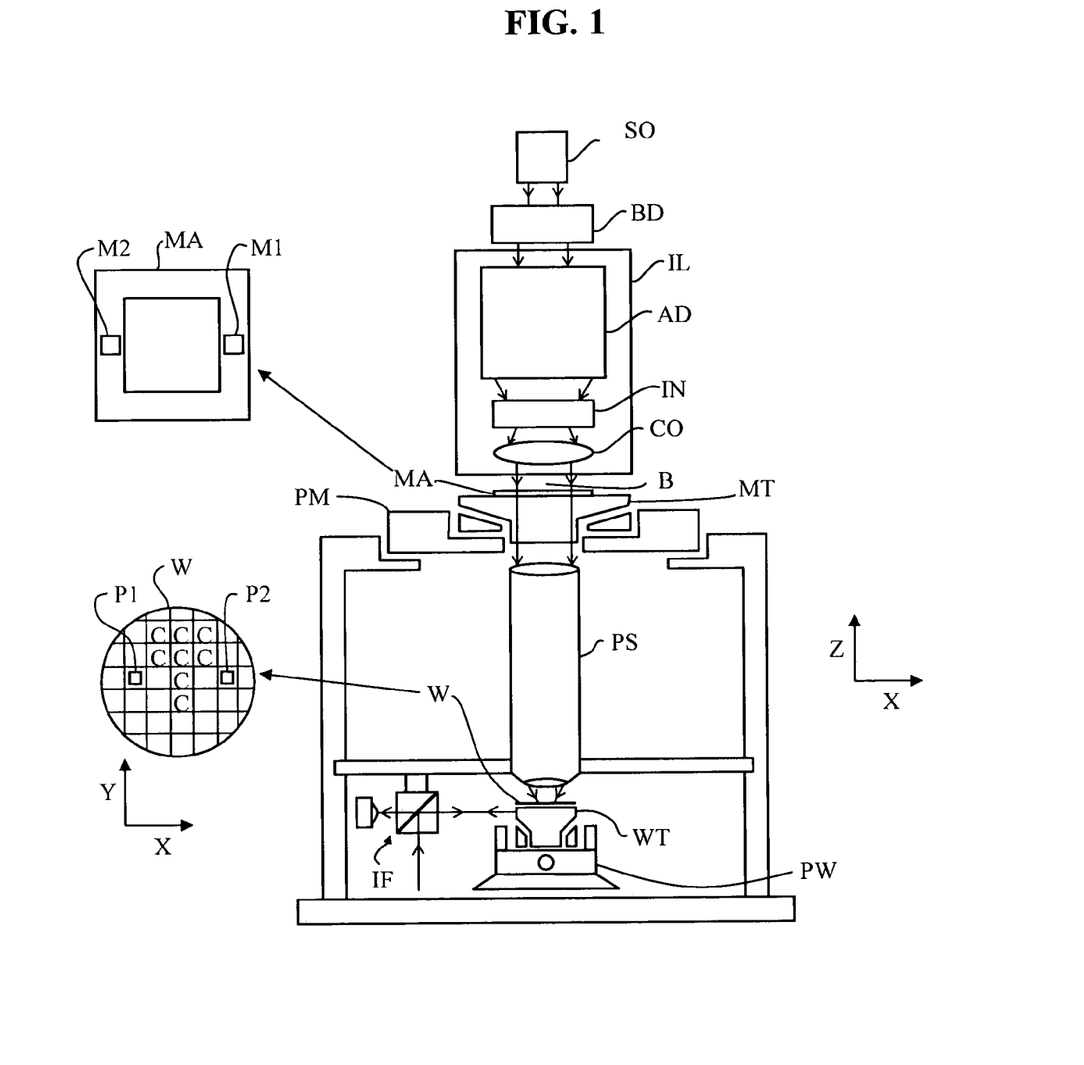
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation) a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
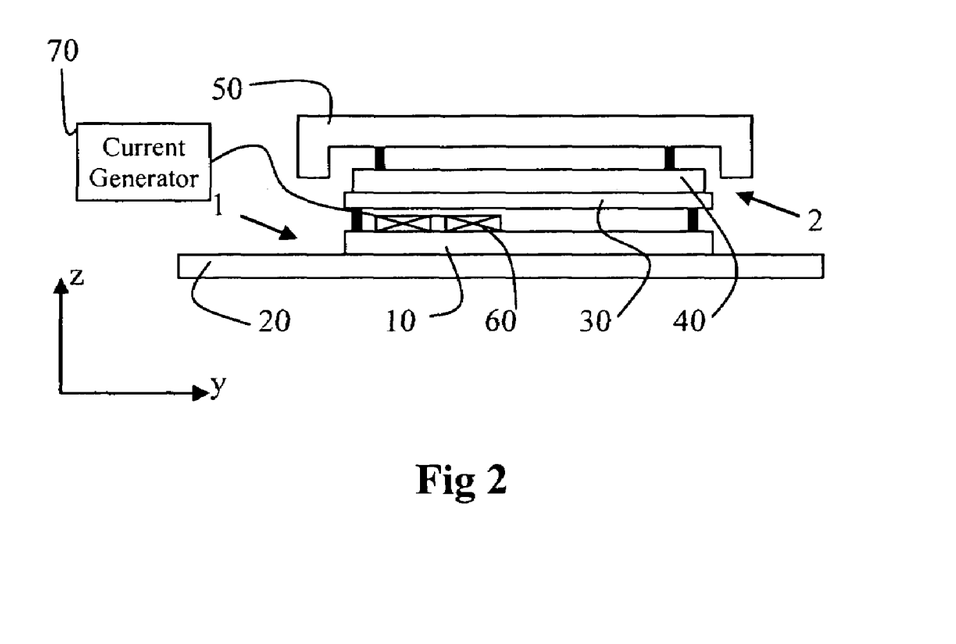
FIG. 2 schematically depicts a stage apparatus according to an embodiment of the present invention.

FIG. 2 schematically depicts a stage apparatus according to an embodiment of the present invention. The stage apparatus includes a long stroke module 1 and a short stroke module 2. In general, the long stroke module is used to displace the object table 50 over comparatively large distances, e.g. about 500 mm or more. This long stroke displacement can be obtained by a displacement of the first part 10 of the long stroke module relative to the second part 20. As an example, the long stroke module may include one or more electromagnetic motors configured to provide the relative displacement. As such, the first part 10 may include an array of coils arranged to co-operate with an array of permanent magnets mounted to the second part 20, the array of permanent magnets and the array of coils forming an electromagnetic motor, e.g. a planar motor. The stage apparatus further includes a short stroke module 2 that is used to provide accurate positioning of the object table 50. The short stroke module 2 includes a first part 30 that is mounted to the first part 10 of the long stroke module and a second part 40. Mounted to the second part 40 of the actuator is an object table 50 suitable to receive e.g. a patterning device or a substrate when the stage apparatus is applied in a lithographic apparatus. The arrangement of the motor and the actuator as shown can be considered a cascaded arrangement whereby the electromagnetic motor is used for long travel of the object table, while the actuator is applied for fine positioning of the object table.

It will be appreciated by the skilled person that a magnetic field of the electromagnetic motor (either from the permanent magnets or, when energized, from the coils) may, to some extend, encompass the electromagnetic actuator, thereby influencing the behavior of the actuator. The part of the magnetic field originating from the electromagnetic motor and influencing the electromagnetic actuator may also be referred to as the stray field of the electromagnetic motor.

In order to compensate, at least partly, the effect of the stray field of the electromagnetic motor, the embodiment as shown includes a coil 60 arranged between the electromagnetic motor and the electromagnetic actuator and a device or current generator 70 configured to supply a current to the coil. The coil can e.g. be mounted to either the electromagnetic motor or to the electromagnetic actuator.

In an embodiment, the device or current generator 70 may include a power amplifier configured to supply the current to the coil. In order to determine the desired amount of current to, at least partly, compensate the effect of the stray field, the stage apparatus may e.g. further include a sensor configured to determine the stray field. Such a sensor may e.g. be a Hall sensor. The sensor may e.g. be located near the electromagnetic actuator or between the electromagnetic actuator and the electromagnetic motor. Alternatively, the sensor can be located elsewhere provided that the sensor measurement signal can be used to generate a signal representing the stray field. The signal may further be applied by a control unit arranged to determine the required current for, at least partly, compensating the stray field. The control unit can e.g. be part of the device or current generator 70.

Figure 3A:
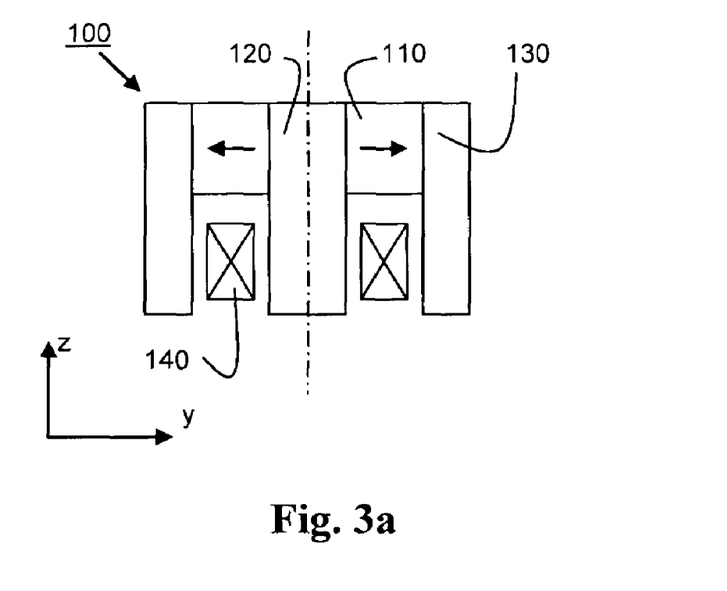
FIGS. 3a and 3b schematically depict an electromagnetic actuator.
Figure 3B:
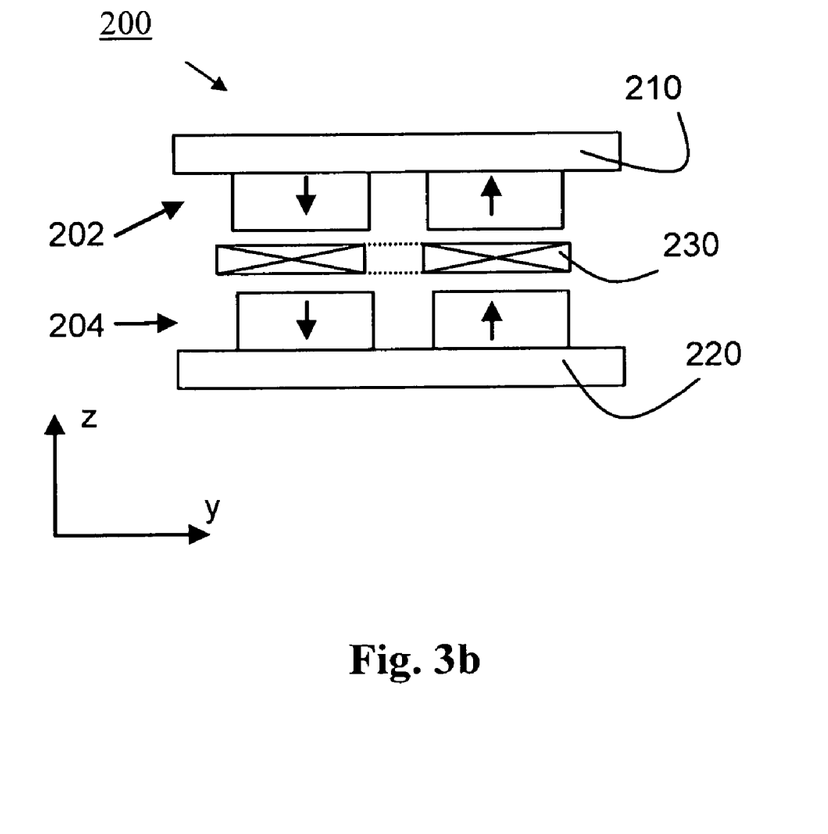

FIGS. 3a and 3b schematically depict known actuators that can be applied in the short stroke module of the stage apparatus according to an embodiment of the present invention.

FIG. 3a schematically depicts an actuator 100 including a coil 140 arranged to co-operate with a magnet assembly including a permanent magnet 110 enclosed by two ferromagnetic components 120 and 130. By energizing the coil 140, a force in the Z-direction can be generated between the coil and the magnet assembly.

FIG. 3b schematically depicts another type of actuator 200 including a coil 230 enclosed by two magnet assemblies 202, 204 each including a ferromagnetic yoke 210, 220 and a pair of permanent magnets. By energizing the coil 230, a force in the Y-direction can be generated.

Figure 4A:
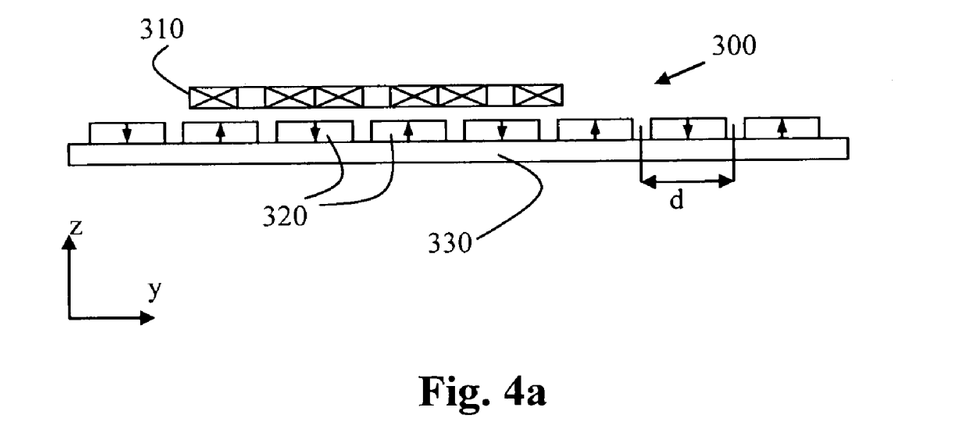
FIGS. 4a and 4b schematically depict an electromagnetic motor.
Figure 4B:
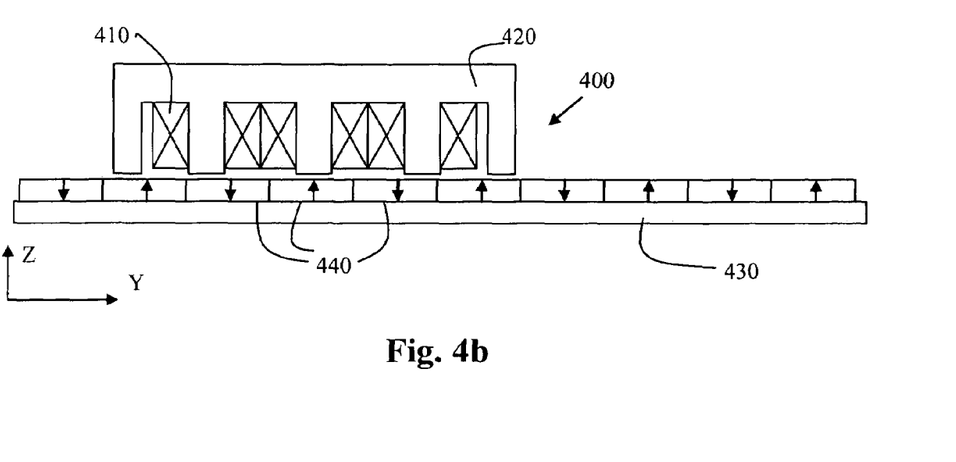

FIGS. 4a and 4b schematically depict two electromagnetic motors as known in the art that can be applied in a stage apparatus according to the present invention.

FIG. 4a schematically depicts an electromagnetic motor 300 including and array of coils 310 that is movable relative to an array of permanent magnets 320 mounted to a ferromagnetic yoke 330. By supplying the appropriate currents to the coils 310, a force can be generated between the array of coils and the array of permanent magnets, the force can be directed both in the y-direction and in the z-direction. Also shown in FIG. 4a is the magnet pitch d of the permanent magnets forming the array of permanent magnets.

The electromagnetic motor 400 as shown in FIG. 4b differs from the motor of FIG. 4a in that it includes a ferromagnetic yoke 420 on which the array of coils 410 is mounted. The motor further includes an array of permanent magnets 440 mounted on a ferromagnetic yoke 430.

Figure 5:
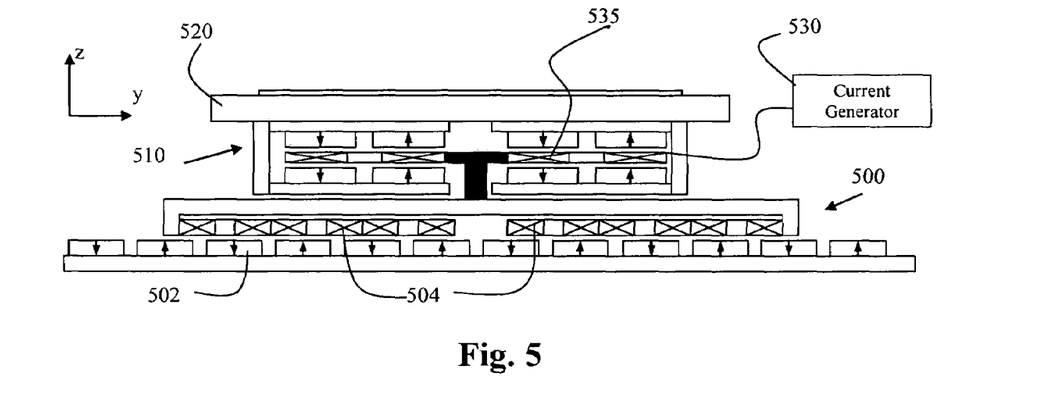
FIG. 5 schematically depicts a stage apparatus according to an embodiment of the present invention.
Figure 6:
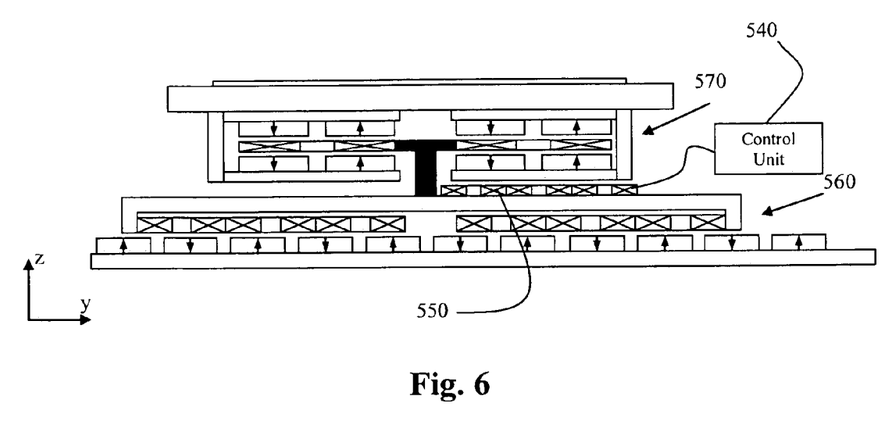
FIG. 6 schematically depicts a stage apparatus according to an embodiment of the present invention.

FIG. 5 schematically depicts a stage apparatus according to an embodiment of the present invention. The embodiment as shown includes an electromagnetic motor 500 including an array of permanent magnets 502 arranged to co-operate with an array of coils 504 thereby allowing comparatively large displacements of the coil array relative to the magnet array in the Y-direction. The electromagnetic motor 500 may e.g. be a planar motor arranged to displace the object table 520 in 6 degrees of freedom; such a planar motor is capable of providing a displacement over comparatively large distances in both X- and Y-direction (the X-direction being substantially perpendicular to both the Y- and the Z-direction), and a comparatively small displacement in the other degrees of freedom. An example of a planar motor can e.g. be found in U.S. Pat. No. 6,531,793. Mounted to the electromagnetic motor is a short stroke assembly 510 that includes two electromagnetic actuators similar to the actuators of FIG. 3b. The coils of the actuators are mounted to the coil assembly of the electromagnetic motor while the magnet assemblies are mounted to object table 520. The stage apparatus further includes a device or current generator 530 configured to supply a compensating current to a coil 535 of the actuators. The compensating current is selected to at least partly compensate a stray field of the electromagnetic motor. Alternatively, the compensating current can be supplied to a separate coil or coil set, as shown in FIG. 6. In the arrangement as shown, whereby the magnet array of the electromagnetic motor is substantially longer (in the Y-direction) than the coil array, the magnet array is usually stationary while the coil array is moved. Note however that the inverse arrangement can also be applied. Such an arrangement may include a coil array that is substantially longer than the magnet array. In such an arrangement, the coil array can remain stationary while the magnet array is moved.

FIG. 6 schematically depicts a stage apparatus according to an embodiment of the present invention wherein the compensating current is supplied to a separate set of coils 550 by a control unit 540. The set of coils is arranged between the electromagnetic motor 560 and the electromagnetic actuator of the short stroke module 570. By doing so, the stray field originating from the electromagnetic motor can, at least party, be compensated. As an example, three coils (or a multiple of three) may be arranged next to each (or partly overlapping), the coils being powered by a three-phase power supply in order to generate a magnetic field that, at least partly opposes the stray field of the electromagnetic motor. By appropriate choice of currents, the magnetic field generated by the multiple coils can provide an improved compensation of the stray field for different positions of the electromagnetic motor. Preferably, the multiple coils are arranged to generate a magnetic field having the same pitch as the pitch of the stray field of the electromagnetic motor. In order to obtain this, it may be desirable to have a size of the coils (i.e. the coil pitch) correspond to the magnetic pitch of the stray field. It may further be noted that other positions may also be considered for positioning the set of coils as compared to the position shown in FIG. 6.

Figure 7:
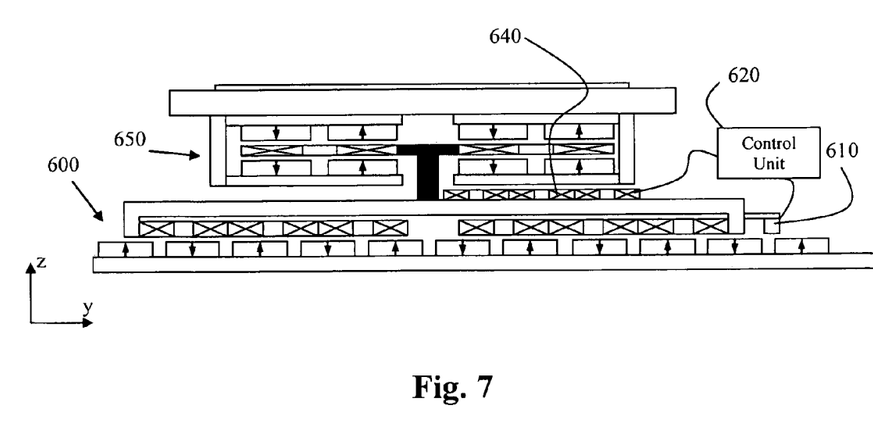
FIG. 7 schematically depicts a stage apparatus according to an embodiment of the present invention.

In general, the stray field of the electromagnetic motor may e.g. be known from a measurement by a sensor or from a calibration of the electromagnetic motor. FIG. 7 schematically depicts a stage apparatus according to an embodiment of the present invention provided with a sensor 610 configured to measure a magnetic field of the electromagnetic motor 600. The measurement can be applied by a control unit 620 configured to control a current of an array of coils 640 arranged between the electromagnetic motor 600 and a short stroke assembly 650. The sensor 610 may also be located elsewhere. As an example, the sensor can be mounted between the electromagnetic motor 600 and the short stroke module or even inside the short stroke module.

A calibration of the electromagnetic motor can e.g. include a measurement of the stray field of the electromagnetic motor (at a predetermined location) as a function of the position of the coil array of the electromagnetic motor relative to the magnet array. This calibration may then be applied by a control unit to, at least partly, compensate the stray field effect. Alternatively, the control unit may use the calibration data to add a compensating current to the actuator current that would be desired in the absence of the stray field. This arrangement provides a benefit that no separate coil is required to compensate the stray field and no separate power supply configured to provide the compensating current (such an arrangement is e.g. shown in FIG. 5).

As will be appreciated by the skilled person, the stray field of the electromagnetic motor may depend on various parameters, such as the instantaneous value of the current supplied to the electromagnetic motor or the relative position of the first and second part of the electromagnetic motor. To illustrate this, a 'so-called' planar motor as e.g. described in U.S. Pat. No. 6,531,793 can be considered as electromagnetic motor. Such a planar motor may include a stationary magnet plate including a checkerboard pattern of permanent magnets and a coil unit that is movable relative to the magnet plate. In such an arrangement, it will be appreciated by the person skilled in the art that an electromagnetic actuator that is mounted to the coil unit may experience a stray field originating from the magnet plate, the stray field depending on the relative position of the magnet plate and the coil unit.

Figure 8:
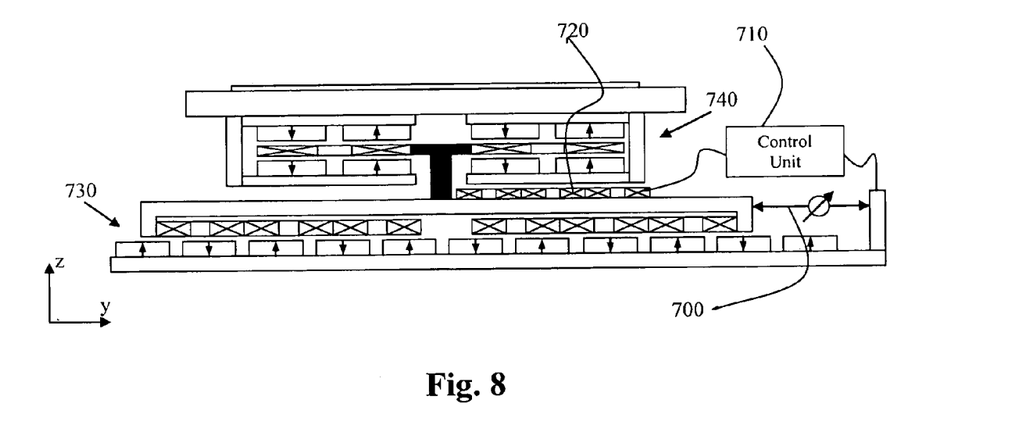
FIG. 8 schematically depicts a stage apparatus according to an embodiment of the present invention.

In an embodiment of the present invention, the stray field of the electromagnetic motor (e.g. a planar motor) is estimated based on the relative position of both parts of the electromagnetic motor. In general, a stage apparatus may include a position measurement system configured to determine the position of the object table. As such, it may be possible to apply this position measurement system configured to determine the relative position of both parts of the electromagnetic motor. FIG. 8 schematically depicts a stage apparatus according to an embodiment of the present invention, including a position measurement system 700. The position measurement can be applied in a control unit 710 to generate a current for, at least partly, compensating the stray field. The current can be supplied to one or more coils 720 arranged between a long stroke motor 730 of the stage apparatus and a short stroke assembly 740. As an example, the stray field as a function of the position of the object table can be determined once (as a calibration or initialization step) and the data can be stored, e.g. in the control unit. As such, an online measurement of the stray field during the operation of the stage apparatus is no longer required.

In a preferred embodiment, the coil (or coils) arranged to receive a current to compensate the stray field have a size that substantially corresponds to a magnetic pitch of the stray field. By doing so, an improved compensation of the stray field can be obtained.

In an embodiment of the present invention, the compensating current is supplied to a coil of the electromagnetic actuator rather than to a separate coil arranged near the actuator. In case the stray field of the electromagnetic motor is known (either by a measurement or based on e.g. a position of the stage apparatus), this information can be applied by a control unit configured to control the actuator to adjust the actuator current compared to the actuator current that would be required in the absence of the stray field. This arrangement provides a benefit that no separate coil is required to compensate the stray field and no separate power supply configured to provide the compensating current.

Figure 9:
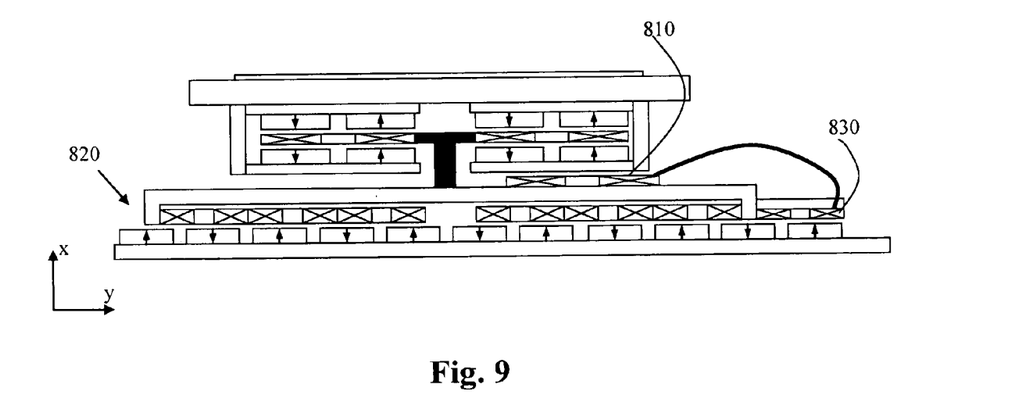
FIG. 9 schematically depicts a stage apparatus according to an embodiment of the present invention.

In an embodiment of the present invention (see FIG. 9), the stage apparatus is provided with one or more compensating coils 810 configured to, at least partly, compensate a stray field of an electromagnetic motor 820 of the stage apparatus and with a further coil 830 arranged to co-operate with the magnetic field of the electromagnetic motor. During operation of the electromagnetic motor, the interaction between the further coil and the magnetic field of the electromagnetic motor may induce a voltage in the further coil 830. By connecting the further coil with the compensating coil(s) 810, the induced voltage in the further coil can be applied as a power supply configured to provide a current to the stray field compensating coil 810. In a preferred embodiment, the further coil and the coil are connected in series.

In the embodiments as shown, a cascaded arrangement of an electromagnetic motor and an electromagnetic actuator is applied in the stage apparatus for positioning an object table. Note however that a cascaded arrangement is not a requirement for applying the present invention. As an alternative, the stage apparatus may include a drive unit including a first part that is movable relative to a second part wherein the first part includes both a coil set of a linear motor and one or more coils for an electromagnetic actuator and wherein the second part includes an array of permanent magnets arranged to co-operate with the coil set of the linear motor and a permanent magnet assembly arranged to co-operate with the one or more coils.

It may further be noted that in general, the positioning of an object table of a lithographic apparatus is done by a plurality of actuators. Preferably, a set of actuators is applied that enables the positioning of the object table in 6 degrees of freedom. In case a separate coil or coil set is applied for at least partly compensating the stray field, it may be advantageous to arrange the coil or coil set such that it compensates the influence of the stray field on more than one actuator. By doing so, the number of coils or coil sets can be kept low compared to the number of actuators.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A stage apparatus configured to position an object table comprising:
   an electromagnetic motor arranged to displace the object table;
   an electromagnetic actuator configured to position the object table; and
   a current generator configured to provide a current to the stage apparatus such that, in use, an effect of a stray field of the electromagnetic motor on the electromagnetic actuator is at least partly compensated by the current.

2. The stage apparatus according to claim 1, wherein the current is provided to a coil of the electromagnetic actuator.

3. The stage apparatus according to claim 2, wherein the current generator comprises a power amplifier.

4. The stage apparatus according to claim 1, wherein the current is provided to a coil mounted to the electromagnetic motor or the electromagnetic actuator.

5. The stage apparatus according to claim 4, further comprising an additional coil arranged to co-operate with a magnetic field of the electromagnetic motor and arranged to, in use, power the coil.

6. The stage apparatus according to claim 4, wherein the device comprises a control unit configured to control the current.

7. The stage apparatus according to claim 6, wherein the control unit is arranged to receive an input signal to determine the current.

8. The stage apparatus according to claim 7, further comprising a sensor configured to generate the input signal.

9. The stage apparatus according to claim 7, wherein the input signal comprises a position measurement.

10. The stage apparatus according to claim 7, wherein the input signal comprises a magnetic field measurement.

11. The stage apparatus according to claim 10, further comprising a Hall sensor configured to perform the magnetic field measurement.

12. A lithographic apparatus comprising:
   an illumination system configured to condition a radiation beam;
   a patterning device support constructed to support a patterning device, the patterning device being capable of imparting the radiation beam with a pattern in its cross-section to form a patterned radiation beam;
   a substrate support constructed to hold a substrate;
   a projection system configured to project the patterned radiation beam onto a target portion of the substrate, and
   a stage apparatus configured to displace one of the supports, the stage comprising
      an electromagnetic motor arranged to displace the one of the supports;
      an electromagnetic actuator configured to position the one of the supports; and
      a current generator configured to provide a current to the stage apparatus such that, in use, an effect of a stray field of the electromagnetic motor on the electromagnetic actuator is at least partly compensated by the current.

13. The lithographic apparatus according to claim 12, wherein the current is provided to a coil mounted to the electromagnetic motor or the electromagnetic actuator.

14. The lithographic apparatus according to claim 13, wherein the stage apparatus further comprises an additional coil arranged to co-operate with a magnetic field of the electromagnetic motor and arranged to, in use, power the coil.

15. The lithographic apparatus according to claim 13, wherein the current generator comprises a power amplifier.

16. The lithographic apparatus according to claim 13, wherein the current generator is arranged to receive an input signal to determine the current.

17. The lithographic apparatus according to claim 16, wherein the stage apparatus further comprises a sensor configured to generate the input signal.

18. A stage apparatus configured to move a support in a lithographic apparatus, the support configured to hold a substrate or a patterning device, the stage apparatus comprising:
   a first electromagnetic motor arranged to generate a relatively large displacement of the support;
   a second electromagnetic motor configured to generate a relatively small displacement of the support, the second electromagnetic motor arranged on the first electromagnetic motor; and
   a current generator configured to provide a current to a coil arranged in the stage apparatus, the current being selected such that, in use, a corresponding field produced by the coil substantially reduces an effect of a field of the first electromagnetic motor on the second electromagnetic motor.

* * * * *

UNITED STATES PATENT AND TRADEMARK OFFICE
CERTIFICATE OF CORRECTION

| | | |
|---|---|---|
| PATENT NO. | : 7,348,752 B1 | Page 1 of 1 |
| APPLICATION NO. | : 11/523736 | |
| DATED | : March 25, 2008 | |
| INVENTOR(S) | : Hans Butler | |

It is certified that error appears in the above-identified patent and that said Letters Patent is hereby corrected as shown below:

On the Title Page, add:

(65)     Prior Publication Data

US 2008/0067967 A1     March 20, 2008

Signed and Sealed this

Seventh Day of October, 2008

JON W. DUDAS
*Director of the United States Patent and Trademark Office*